(12) United States Patent
Takahashi (10) Patent No.: US 11,282,713 B1
(45) Date of Patent: Mar. 22, 2022

(54) SEMICONDUCTOR MANUFACTURING APPARATUS AND METHOD OF MANUFACTURING SEMICONDUCTOR DEVICE

(71) Applicant: Kioxia Corporation, Tokyo (JP)

(72) Inventor: Atsushi Takahashi, Yokkaichi (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/173,287

(22) Filed: Feb. 11, 2021

(30) Foreign Application Priority Data

Sep. 8, 2020 (JP) .............................. JP2020-150725

(51) Int. Cl.
*H01L 21/311* (2006.01)
*H01L 21/67* (2006.01)
*H01L 27/115* (2017.01)

(52) U.S. Cl.
CPC .. *H01L 21/31144* (2013.01); *H01L 21/31116* (2013.01); *H01L 21/67069* (2013.01); *H01L 27/115* (2013.01)

(58) Field of Classification Search
None
See application file for complete search history.

(56) References Cited

U.S. PATENT DOCUMENTS 6,743,727 B2 6/2004 Mathad et al.
2019/0189423 A1 6/2019 Ishino et al.

FOREIGN PATENT DOCUMENTS

| JP | 3659933 B2 | 6/2005 |
| JP | 2006-237356 A | 9/2006 |
| JP | 2019-110275 A | 7/2019 |

*Primary Examiner* — Roberts P Culbert
(74) *Attorney, Agent, or Firm* — Oblon, McClelland, Maier & Neustadt, L.L.P.

(57) ABSTRACT

In one embodiment, a method of manufacturing a semiconductor device includes forming a first film on a substrate. The method further includes etching the first film with first gas including carbon and fluorine to form a concave portion in the first film and form a second film in the concave portion. The method further includes treating the second film by using the second film to second gas or second liquid, wherein the second film is treated without plasma.

13 Claims, 7 Drawing Sheets

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2020-150725, filed on Sep. 8, 2020, the entire contents of which are incorporated herein by reference.

FIELD

Embodiments described herein relate to a semiconductor manufacturing apparatus and a method of manufacturing a semiconductor device.

BACKGROUND

When a concave portion is formed in a process target film on a substrate, a sidewall film is occasionally formed on a side face of the concave portion to prevent the concave portion from taking a bowing shape. However, the side face of the concave portion cannot be sufficiently protected with the sidewall film depending on a method of forming the sidewall film.

BRIEF DESCRIPTION OF THE DRAWINGS

FIGS. 1A to 2C are sectional views showing a method of manufacturing a semiconductor device of a first embodiment;

DETAILED DESCRIPTION

Embodiments will now be explained with reference to the accompanying drawings. In FIGS. 1A to 7B, the same components are given the same signs and their duplicated description is omitted.

In one embodiment, a method of manufacturing a semiconductor device includes forming a first film on a substrate. The method further includes etching the first film with first gas including carbon and fluorine to form a concave portion in the first film and form a second film in the concave portion. The method further includes treating the second film by using the second film to second gas or second liquid, wherein the second film is treated without plasma.

(First Embodiment)

FIGS. 1A to 2C are sectional views showing a method of manufacturing a semiconductor device of a first embodiment. The semiconductor device of the present embodiment is, for example, a three-dimensional memory.

Figure 1A:
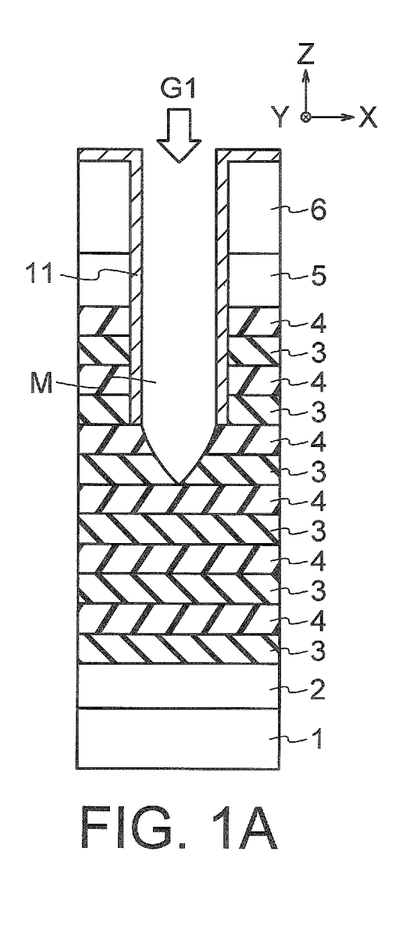

First, a lower layer 2 is formed on a substrate 1, and a stacked film alternately including a plurality of insulating layers 3 and a plurality of insulating layers 4 is formed on the lower layer 2 (FIG. 1A). The insulating layers 3 are examples of first insulating layers, and the insulating layers 4 are examples of second insulating layers. Next, an upper layer 5 is formed on the stacked film, and a hard mask layer 6 is formed on the upper layer 5 (FIG. 1A). The lower layer 2, the insulating layers 3, the insulating layers 4, the upper layer 5 and the hard mask layer 6 are a process target film on the substrate 1 of the present embodiment. The process target film is an example of a first film.

The substrate 1 is, for example, a semiconductor substrate such as a silicon (Si) substrate. FIG. 1A shows an X-direction and a Y-direction which are parallel to a surface of the substrate 1 and perpendicular to each other, and a Z-direction perpendicular to the surface of the substrate 1. In the present specification, the +Z-direction is regarded as the upward direction, and the −Z-direction is regarded as the downward direction. The −Z-direction may coincide with the direction of gravity or does not have to coincide with the direction of gravity.

The lower layer 2 includes, for example, insulators such as a silicon oxide film(s) ($SiO_2$) and a silicon nitride film(s) (SiN), and a conducting layer formed between the insulators. The insulating layers 3 are, for example, silicon nitride films. The insulating layers 4 are, for example, silicon oxide films. The upper layer 5 includes, for example, insulators such as a silicon oxide film(s) and a silicon nitride film(s), and a conducting layer formed between the insulators. The hard mask layer 6 is, for example, an organic film.

Next, an etching treatment of etching the process target film on the substrate 1 is performed (FIG. 1A). Specifically, an opening for forming a memory hole M is formed in the hard mask layer 6 by lithography and etching. Then, the insulating layers 3, the insulating layers 4 and the upper layer 5 are etched using the hard mask layer 6 as a mask. Consequently, the memory hole M is formed halfway in the insulating layers 3, insulating layers 4 and the upper layer 5. The memory hole M and the opening are examples of a concave portion. The aforementioned etching treatment is an example of a first treatment.

The aforementioned etching treatment is performed using gas G1 including, for example, the carbon element and the fluorine element. The gas G1 includes, for example, $C_xH_yF_z$ gas. Note that C, H and F denote carbon, hydrogen and fluorine, respectively, and x, y and z denote an integer of one or more, an integer of zero or more, and an integer of one or more, respectively ($x \geq 1$, $y \geq 0$, $z \geq 1$). When $y=0$, $C_xH_yF_z$ is fluorocarbon, and when $y \neq 0$, $C_xH_yF_z$ is hydrofluorocarbon. Examples of the $C_xH_yF_z$ gas include $C_4F_6$ gas, $C_4F_8$ gas and $CH_2F_2$ gas. The gas G1 is an example of first gas for treating the first film.

In the aforementioned etching treatment, the etching is performed with $C_xH_yF_z$ plasma generated from the $C_xH_yF_z$ gas, and a sidewall film 11 is formed on the surfaces and the like of the insulating layers 3, the insulating layers 4, the upper layer 5 and the hard mask layer 6 which are exposed in the memory hole M and the opening (FIG. 1A). The sidewall film 11 is, for example, a fluorocarbon film including the carbon element and the fluorine element. The sidewall film 11 is an example of a second film.

Figure 1B:
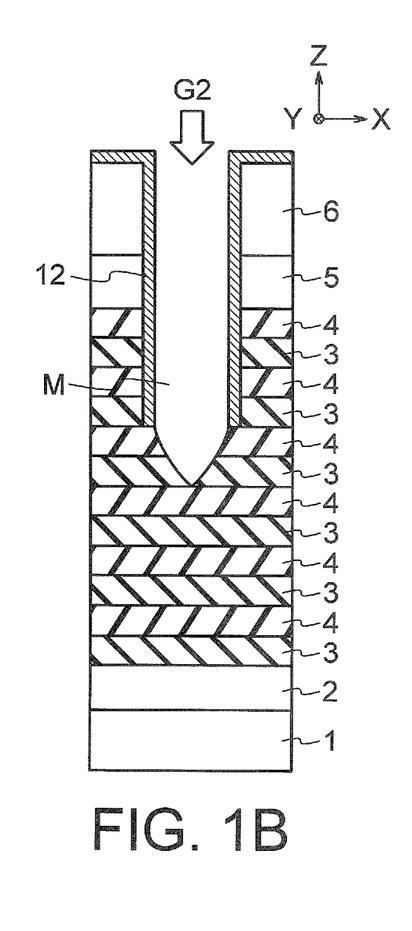

Next, a reforming treatment of reforming the sidewall film 11 is performed (FIG. 1B). In the present embodiment, the sidewall film 11 is reformed, for example, by reducing the sidewall film 11. FIG. 1B shows a reformed sidewall film 12 obtained by reforming the sidewall film 11. The aforementioned reforming treatment is an example of a second treatment.

The aforementioned reforming treatment is performed using, for example, gas G2 including the hydrogen element. The gas G2 includes, for example, HCOOH (formic acid) gas. Note that O denotes oxygen. Formic acid is liquid at ambient temperature and ambient pressure. In the present embodiment, the HCOOH gas is generated from HCOOH liquid, and the sidewall film 11 is reformed using the HCOOH gas. In the aforementioned reforming treatment, the sidewall film 11 is reformed by exposing the sidewall film 11 to the HCOOH gas. In the present embodiment, while the aforementioned etching treatment is performed using plasma, the aforementioned reforming treatment is performed not using plasma. The gas G2 is an example of second gas for treating the second film.

Hereafter, the reforming treatment of the sidewall film 11 is described in detail.

As mentioned above, the sidewall film 11 is, for example, a fluorocarbon film including the carbon element and the fluorine element. While the sidewall film 11 functions as a protecting film for the process target film in etching, there is a case where the sidewall film 11 conversely contributes etching when ions at high energy enter the sidewall film 11. Namely, there is a concern that the sidewall film 11 promotes etching of the process target film in the memory hole M. This is because the sidewall film 11 serves as a source of $CF_a$ in the following expression (1).

$$SiO_2 + CF_a \rightarrow SiF_b\uparrow + CO_c\uparrow \tag{1}$$

Note that a, b and c denote composition ratios. As mentioned above, the insulating layers 4 are, for example, silicon oxide films ($SiO_2$ films). Moreover, there is a case where the lower layer 2 and the upper layer 5 include silicon oxide films. These silicon oxide films are possibly etched through the reaction of expression (1).

According to expression (1), when the quantity of fluorine atoms in the sidewall film 11 is reduced, the supply amount of $CF_a$ can be reduced and the process target film in the memory hole M can be restrained from being etched. Therefore, the sidewall film 11 is reformed in the aforementioned reforming treatment, and specifically, fluorine atoms in the sidewall film 11 are caused to react with hydrogen atoms in the gas G2 (reduction reaction) to be eliminated as hydrogen fluoride. Thereby, the reformed sidewall film 12 richer in carbon than the sidewall film 11 can be obtained, and a fluorine concentration in the reformed sidewall film 12 can be reduced to be less than a fluorine concentration in the sidewall film 11. In other words, a ratio of carbon amount per fluorine amount in the reformed sidewall film 12 becomes larger than a ratio of carbon amount per fluorine amount in the sidewall film 11 by being treated with the gas G2. Therefore, even when ions at high energy enter the reformed sidewall film 12, the reaction of expression (1) hardly occurs and the process target film in the memory hole M is restrained from being etched.

The present embodiment therefore makes it possible to restrain the sidewall film 11 from contributing etching and to cause the reformed sidewall film 12 to function as a protecting film. This makes it possible to restrain the memory hole M from taking a bowing shape.

Subsequently, annealing in the reforming treatment of the sidewall film 11 is described in detail.

It can be considered that the aforementioned reforming treatment is performed using plasma generated from the gas G2 as in the aforementioned etching treatment. The plasma can promote the reforming treatment. However, the plasma is possibly not able to reach a deep place in the memory hole M. There is a possibility, in such a case, that the sidewall film 11 is not sufficiently reformed at the deep place in the memory hole M and the process target film in the memory hole M is not sufficiently restrained from being etched. This problem is considered as more apparent, for example, when three-dimensional memories are to have a further larger capacity and to make the aspect ratio of memory holes M further higher.

Therefore, in the aforementioned reforming treatment of the present embodiment, the sidewall film 11 is reformed by exposing the sidewall film 11 to the gas G2. This makes it possible to reform the sidewall film 11 not using plasma. This reforming treatment makes it possible to sufficiently reform the sidewall film 11 down to the deep place in the memory hole M and makes it possible to form a more conformal reformed sidewall film 12 than in the case using plasma. Exposing the sidewall film 11 to the gas G2 includes, for example, annealing the sidewall film 11 in an atmosphere of the gas G2 or exposing the sidewall film 11 to the gas G2 at a predetermined temperature.

Examples of gas included in the gas G2 include $H_2$ (hydrogen) gas and the aforementioned HCOOH (formic acid) gas. When the reforming treatment is performed using $H_2$ gas, annealing is desirably performed in an atmosphere of $H_2$ gas in order to sufficiently reduce a fluorocarbon film (sidewall film 11) and the annealing is desirably performed at or above 300° C. In general, an upper limit of a process temperature in a dry etching chamber is 100 to 150° C. and it is difficult to reduce the fluorocarbon film (sidewall film 11) with $H_2$ gas at or below the upper limit. Therefore, when the aforementioned etching treatment is performed in this chamber, it is difficult to perform the reforming treatment using $H_2$ gas subsequently in the chamber. Therefore, when the reforming treatment is performed using $H_2$ gas, this reforming treatment and the aforementioned etching treatment are desirably performed in separate chambers.

Meanwhile, HCOOH gas has higher reducing ability than $H_2$ gas and has 100° C. of low boiling point. Therefore, when the reforming treatment is performed using HCOOH gas, annealing is performed at 100 to 150° C. in an atmosphere of HCOOH gas.

Performing the annealing at 100 to 150° C. makes it possible to sufficiently reduce the fluorocarbon film (sidewall film 11). Therefore, when the reforming treatment is performed using HCOOH gas, this reforming treatment and the aforementioned etching treatment can be performed in the same chamber. Namely, the reforming treatment and the aforementioned etching treatment can be performed in-situ.

The reforming treatment may be performed by feeding HCOOH gas into an etching chamber at a predetermined temperature. For example, HCOOH gas may be fed after the temperature of the etching chamber is set to a temperature not more than the upper limit of the process temperature in the etching chamber. For example, HCOOH gas may be fed into the etching chamber at 150° C. The temperature of an etching chamber in an etching treatment is typically room temperature to 60° C. When the reforming treatment of the sidewall film sufficiently progresses, HCOOH gas may be fed into the etching chamber at a temperature comparable to that of the etching treatment. The temperature of the etching chamber is, for example, a stage temperature in the etching chamber. Using HCOOH gas makes it possible to simplify steps of manufacturing a semiconductor device of the present embodiment and to improve productivity of semiconductor devices.

Formic acid (HCOOH) is a substance that is liquid at ambient temperature and ambient pressure. Therefore, in the reforming treatment of the present embodiment, HCOOH gas is generated from HCOOH liquid, and the sidewall film 11 is reformed using the HCOOH gas. HCOOH gas has 100° C. of low boiling point and can be vaporized by a vaporizer to be introduced into the chamber. The gas G2 may include gas other than HCOOH gas and may include other gas, for example, obtained from a substance that is liquid at ambient temperature and ambient pressure. Moreover, in the aforementioned reforming treatment, the sidewall film 11 may be reformed by annealing the sidewall film 11 in an atmosphere of liquid instead of the gas G2. This liquid is an example of second liquid. The liquid is, for example, HCOOH liquid. Moreover, in the aforementioned reforming treatment, the sidewall film 11 may be reformed by exposing the sidewall film 11 to the liquid instead of the gas G2 at a predetermined temperature.

Gas included in the gas G2 may be organic gas such as HCOOH gas or may be inorganic gas. Examples of the organic gas include HCHO (formaldehyde) gas and $CH_3OH$ (methyl alcohol) gas. Examples of the inorganic gas include gas of a substance having a silyl group (Si—$R_3$), and include $SiH_4$ gas, $Si_2H_6$ gas and $SiH_2[NH(C_4H_9)]_2$ gas. Note that Si and N denote silicon and nitrogen, respectively. Other examples of the inorganic gas include $AsH_3$ (hydrogen arsenide) gas, $B_2H_6$ (borane) gas, $H_2Se$ (hydrogen selenide) gas, $PH_3$ (phosphine) gas and $GeH_4$ (germane). Moreover, organic liquid or inorganic liquid may be used for the aforementioned reforming treatment instead of the gas G2. When the reforming treatment is performed using $SiH_4$ gas, it is expected that substitution reaction that F atoms are replaced by H atoms as in the following expression (2) takes place.

$$(-CF_2-)_n + SiH_4 \rightarrow (-CH_2-)_n + SiF_4 \uparrow \qquad (2)$$

Note that n denotes an integer of one or more.

The gas G2 may include another element along with the hydrogen element or instead of the hydrogen element. The element is, for example, the sulfur element. The gas G2 may include, for example, $H_2S$ (hydrogen sulfide) gas, $SF_6$ (sulfur hexafluoride) gas or COS (carbonyl sulfide) gas along with HCOOH gas or instead of HCOOH gas. When the gas G2 includes, for example, $H_2S$ gas, the sidewall film 11 is reformed by annealing the sidewall film 11 in an atmosphere of $H_2S$ gas. Liquid including the sulfur element may be used for the aforementioned reforming treatment instead of the gas G2 including the sulfur element.

Moreover, the gas G2 may include He (helium) gas, Ar (argon) gas, Kr (krypton) gas or Xe (xenon) gas along with gas including the hydrogen element and/or the sulfur element.

After that, in the present embodiment, by alternately repeating the aforementioned etching treatment and the aforementioned reforming treatment, the memory hole M is completed. In other words, the memory hole M of the present embodiment is formed by alternately, repeatedly feeding the gas G1 and the gas G2. In the aforementioned reforming treatment, the aforementioned annealing is performed along with feeding the gas G2. Details of these treatments are described below.

Figure 1C:
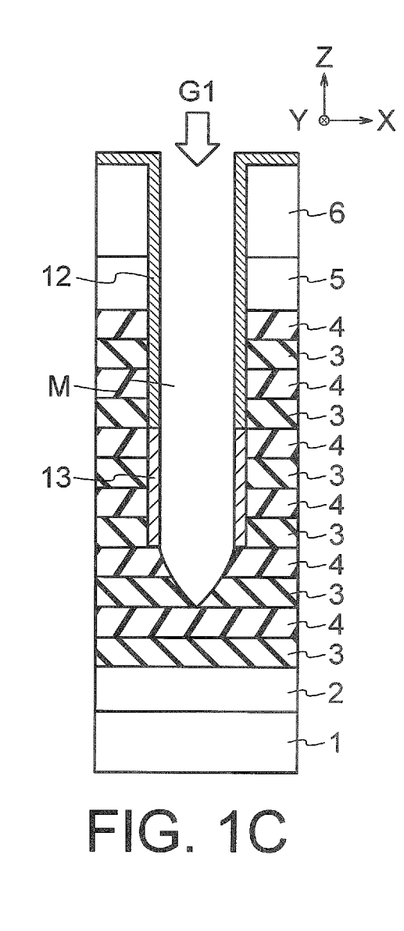

After the step of FIG. 1B, the etching treatment of etching the insulating layers 3 and the insulating layers 4 is performed again using the gas G1 (FIG. 1C). Consequently, the processing of forming the memory hole M progresses and a bottom face of the memory hole M lowers. In this etching treatment, etching is performed with $C_xH_yF_z$ plasma, and a sidewall film 13 is coincidently formed on the surfaces of the insulating layers 3 and the insulating layers 4 exposed in the memory hole M. The sidewall film 13 has properties similar to those of the sidewall film 11 and is formed beneath on the reformed sidewall film 12. The sidewall film 13 is also an example of the second film.

Figure 2A:
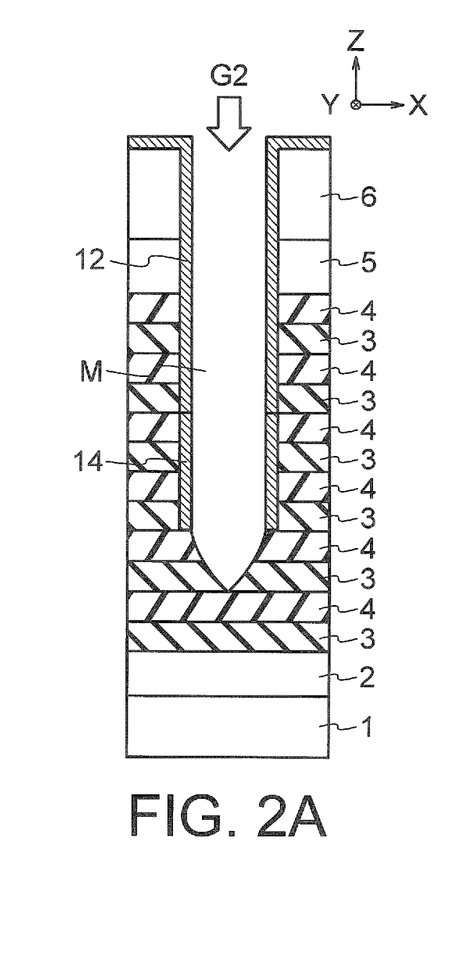

Next, the reforming treatment of reforming the sidewall film 13 is performed again using the gas G2 (FIG. 2A). FIG. 2A shows a reformed sidewall film 14 obtained by reforming the sidewall film 13. In this reforming treatment, the sidewall film 13 is reformed by annealing the sidewall film 13 in an atmosphere of HCOOH gas. The reformed sidewall film 14 has properties similar to those of the reformed sidewall film 12.

Figure 2B:
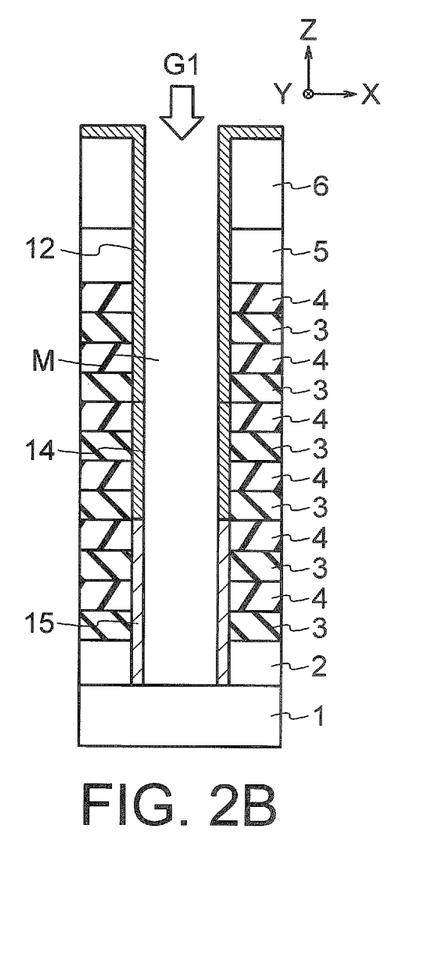

Next, the etching treatment of etching the insulating layers 3 and the insulating layers 4 is performed again using the gas G1 (FIG. 2B). Consequently, the processing of forming the memory hole M progresses, and the bottom face of the memory hole M further lowers. In FIG. 2B, the memory hole M penetrates the lower layer 2 to reach the substrate 1, and the memory hole M is completed. In this etching treatment, etching is performed with $C_xH_yF_z$ plasma, and a sidewall film 15 is coincidently formed on the surfaces of the lower layer 2, the insulating layers 3 and the insulating layers 4 which are exposed in the memory hole M. The sidewall film 15 has properties similar to those of the sidewall films 11 and 13 and is formed beneath on the reformed sidewall film 14. When the memory hole M is not completed by the step of FIG. 2B, the aforementioned reforming treatment and the aforementioned etching treatment are alternately, repeatedly performed afterward until the memory hole M is completed.

Figure 2C:
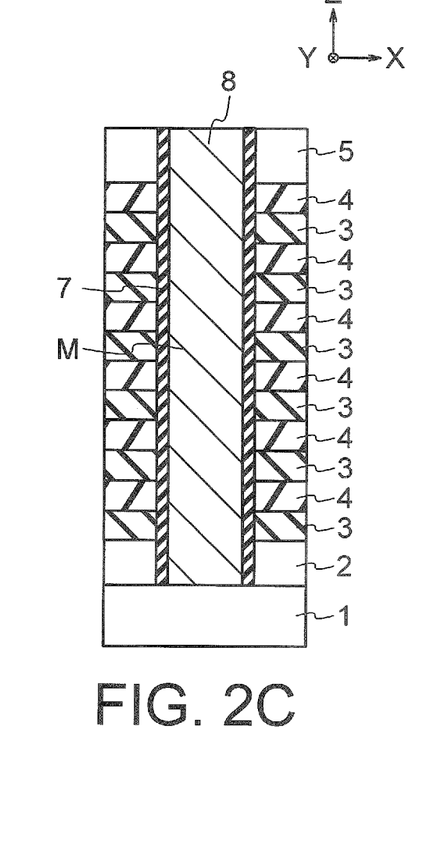

Next, after the reformed sidewall films 12 and 14, the sidewall film 15 and the hard mask layer 6 are removed, a memory insulator 7 and a channel semiconductor layer 8 are sequentially formed in the memory hole M (FIG. 2C). As mentioned later, the memory insulator 7 is formed by sequentially forming a block insulator, a charge storage capacitor and a tunnel insulator in the memory hole M. In the step of FIG. 2C, the memory insulator 7, the channel semiconductor layer 8 and a core insulator may be sequentially formed in the memory hole M.

After that, various inter layer dielectrics, plug layers and line layers and the like are formed on the substrate 1. By doing so, the semiconductor device of the present embodiment is manufactured.

The method shown in FIGS. 1A to 2C can also be applied to a process target film other than the lower layer 2, the insulating layers 3, the insulating layers 4, the upper layer 5 and the hard mask layer 6 and a concave portion other than the memory hole M. This method can also be, for example, applied to a case of forming a contact hole and a trench in inter layer dielectrics and a case of forming a memory hole in a stacked film alternately including a plurality of electrode layers (for example, polysilicon layers) and a plurality of insulating layers (for example, silicon oxide films).

The plurality of insulating layers 3 of the present embodiment are replaced by a plurality of electrode layers in a replacing step performed after the steps shown in FIGS. 1A to 2C. In the replacing step, a plurality of hollows are formed between the insulating layers 4 by removing the insulating layers 3, and the plurality of electrode layers are buried in the hollows. Examples of such electrode layers are described with FIG. 3.

Figure 3:
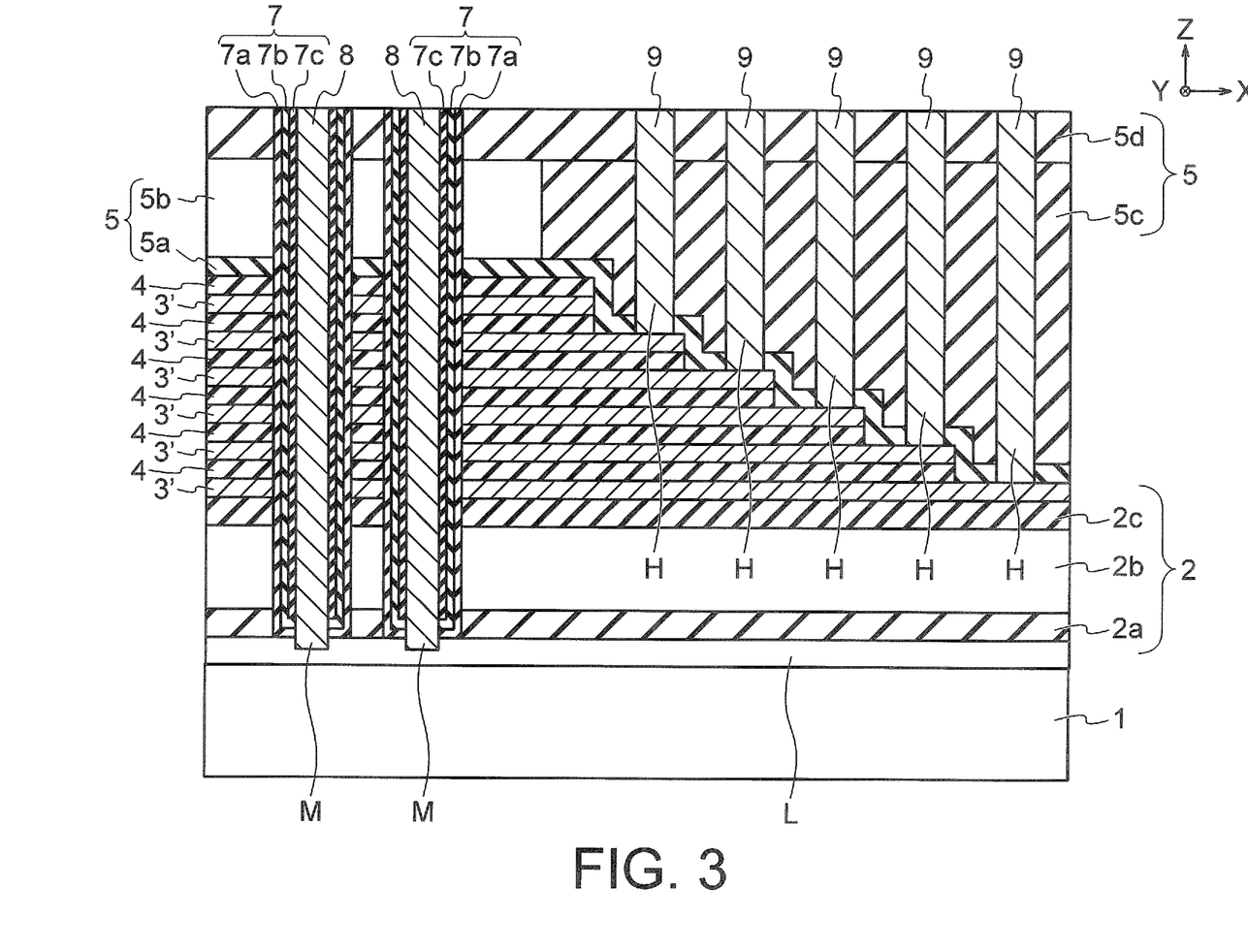
FIG. 3 is a sectional view showing a structure of the semiconductor device of the first embodiment.

FIG. 3 is a sectional view showing a structure of a semiconductor device of the first embodiment. FIG. 3 shows an example of a semiconductor device manufactured by the method of the present embodiment.

FIG. 3 shows a memory cell portion and a stepwise contact portion of a three-dimensional memory. In FIG. 3, the lower layer 2 includes an insulator 2a, a source-side conducting layer 2b and an insulator 2c, and the upper layer 5 includes a cover insulator 5a, a drain-side conducting layer 5b, an inter layer dielectric 5c and an inter layer dielectric 5d. Moreover, the aforementioned plurality of insulating layers 3 have been replaced by a plurality of electrode layers 3' including tungsten (W) layers.

FIG. 3 further shows block insulators 7a, charge storage capacitors 7b and tunnel insulators 7c included in memory insulators 7. The memory insulator 7 and the channel semiconductor layer 8 are formed, for example, by sequentially forming the block insulator 7a, the charge storage capacitor 7b and the tunnel insulator 7c on the surface of the memory hole M, removing the block insulator 7a, the charge storage capacitor 7b and the tunnel insulator 7c from a bottom of the memory hole M, and after that, burying the channel semiconductor layer 8 into the memory hole M. In this stage, the channel semiconductor layer 8 and a core insulator may be sequentially buried into the memory hole M. The channel semiconductor layers 8 are electrically connected to a diffusion layer L in the substrate 1.

FIG. 3 further shows a plurality of contact holes H formed in the upper layer 5, and a plurality of contact plugs 9 formed in these contact holes H. The contact plugs 9 are formed so as to be electrically connected to the corresponding electrode layers 3'.

As above, the memory holes M of the present embodiment are formed by performing the etching treatment using the gas G1 and the reforming treatment using the gas G2. In the etching treatment, etching of the memory holes M progresses and the sidewall films (sidewall films 11 and the like) are formed in the memory holes M. In the reforming treatment, the sidewall films are reformed by exposing the sidewall films to the gas G2.

The present embodiment therefore makes it possible to restrain, with sidewall films, the memory holes M from taking bowing shapes and makes it possible to appropriately realize the memory holes M that have a high aspect ratio. The present embodiment furthermore makes it possible to sufficiently reform the sidewall films down to the deep places in the memory holes M with heat and makes it possible to preferably protect the memory holes M with the reformed sidewall films (reformed sidewall films 12 and the like). As above, the present embodiment makes it possible to preferably form the memory holes M in the process target film on the substrate 1 by reforming the sidewall films not using plasma.

Moreover, the sidewall films of the present embodiment are reformed, for example, using HCOOH gas as the gas G2. This makes it possible to reduce (reform) the sidewall films with the gas G2 having high reducing ability. Consequently, this also makes it possible to reduce the temperature of annealing and to perform the aforementioned etching treatment and the aforementioned reforming treatment in the same chamber. As above, the present embodiment makes it possible to preferably form the memory holes M in the process target film on the substrate 1 by reforming the sidewall films using HCOOH gas. Although the sidewall films are reformed with HCOOH gas and the heat in the present embodiment, the sidewall films may be reformed using HCOOH gas without annealing when the heat is unnecessary. The sidewall films may be reformed using gas other than HCOOH gas.

(Second Embodiment)

Figure 4A:
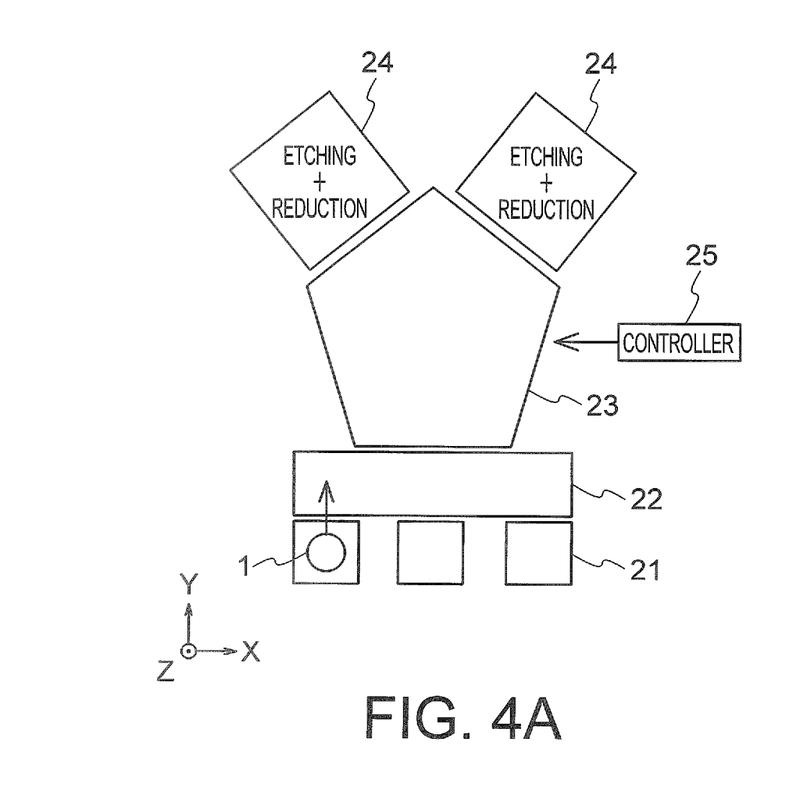
FIGS. 4A and 4B are plan views showing examples of a structure of a semiconductor manufacturing apparatus of a second embodiment.
Figure 4B:
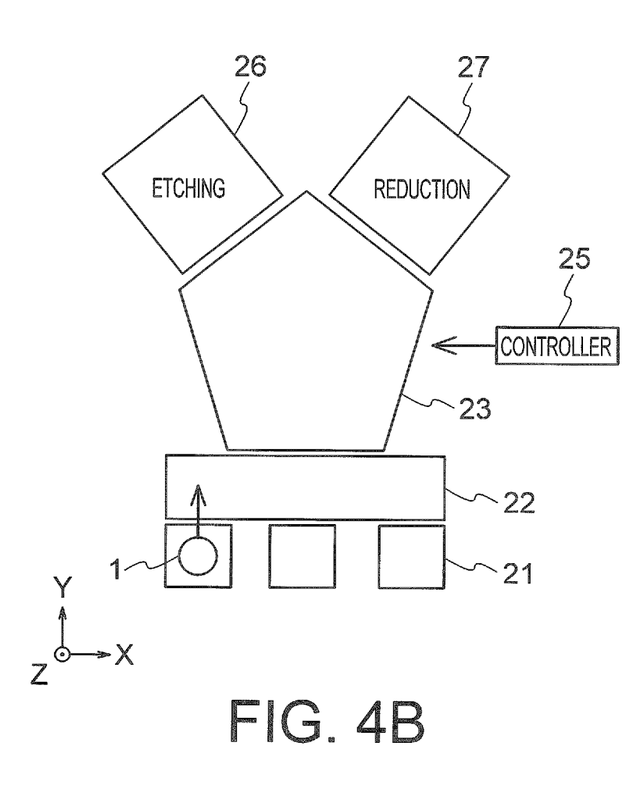

FIGS. 4A and 4B are plan views showing examples of a structure of a semiconductor manufacturing apparatus of a second embodiment.

FIG. 4A shows a first example of the structure of the semiconductor manufacturing apparatus of the present embodiment. The semiconductor manufacturing apparatus of the first example includes a plurality of FOUP (Front-Opening Unified Pod) stages 21, a load lock chamber 22, a transfer chamber 23, a plurality of treatment chambers 24 and a controller 25.

The FOUP stages 21 are used for placing FOUPs (not shown) for containing the substrates 1. When the substrate 1 is conveyed into the semiconductor manufacturing apparatus, a FOUP is placed on any of the FOUP stages 21 and the substrate 1 in the FOUP is conveyed into the load lock chamber 22. When the substrate 1 is conveyed out of the semiconductor manufacturing apparatus, the substrate 1 in the load lock chamber 22 is conveyed out into a FOUP on any of the FOUP stages 21. The substrate 1 conveyed into the semiconductor manufacturing apparatus of the first example is conveyed into any of the treatment chambers 24 via the load lock chamber 22 and the transfer chamber 23.

Each treatment chamber 24 has a function of performing the aforementioned etching treatment and a function of performing the aforementioned reforming treatment (reducing treatment). In the first example, the substrate 1 is conveyed into any of the treatment chambers 24, and the aforementioned etching treatment and the aforementioned reforming treatment alternately, repeatedly performed on the substrate 1 in this treatment chamber 24. In the etching treatment, etching of the memory hole M in the process target film is caused to progress and the sidewall film (sidewall film 11 or the like) is formed in the memory hole M, by treating the process target film on the substrate 1 using the gas G1. In the reforming treatment, the sidewall film is reformed into the reformed sidewall film (reformed sidewall film 12 or the like) by treating the sidewall film using the gas G2. In this reforming treatment, the sidewall film may be reformed by exposing the sidewall film to the gas G2 in the treatment chamber 24 at a predetermined temperature instead of reforming the sidewall film by annealing the sidewall film in an atmosphere of the gas G2.

The semiconductor manufacturing apparatus of the first example is used, for example, for a case using HCOOH gas as the gas G2. The treatment chambers 24 can be used for dry etching and upper limits of process temperatures in chambers of the treatment chambers 24 are typically 100 to 150° C. Annealing cannot be performed at higher temperature than 150° C. in the treatment chambers 24. Nevertheless, using HCOOH gas as the gas G2 makes it possible to reform the sidewall film sufficiently by annealing at 100 to 150° C. The first example makes it possible to perform the aforementioned etching treatment and the aforementioned reforming treatment in-situ in the same treatment chamber 24.

The controller 25 controls various kinds of operation of the semiconductor manufacturing apparatus. For example, the controller 25 controls the conveyance of the substrate 1, and the etching treatments and the reforming treatments in the treatment chambers 24. The controller 25 is, for example, a processor, an electric circuit, a computer or the like.

FIG. 4B shows a second example of the structure of the semiconductor manufacturing apparatus of the present embodiment. The semiconductor manufacturing apparatus of the second example includes an etching chamber 26 and a reduction chamber 27 instead of the aforementioned plurality of treatment chambers 24.

The etching chamber 26 has a function of performing the aforementioned etching treatment. The reduction chamber 27 has a function of performing the aforementioned reforming treatment (reducing treatment). In the second example, the substrate 1 is alternately, repeatedly conveyed into the etching chamber 26 and into the reduction chamber 27, the aforementioned etching treatment is performed on the substrate 1 in the etching chamber 26, and the aforementioned reforming treatment is performed on the substrate 1 in the reduction chamber 27. In the etching treatment, etching of the memory hole M in the process target film is caused to progress and the sidewall film (sidewall film 11 or the like) is formed in the memory hole M, by treating the process target film on the substrate 1 using the gas G1. In the reforming treatment, the sidewall film is reformed into the reformed sidewall film (reformed sidewall film 12 or the like) by treating the sidewall film using the gas G2. In this reforming treatment, the sidewall film may be reformed by exposing the sidewall film to the gas G2 in the reduction chamber 27 at a predetermined temperature instead of reforming the sidewall film by annealing the sidewall film in an atmosphere of the gas G2.

The semiconductor manufacturing apparatus of the second example is used, for example, for a case using $H_2$ gas as the gas G2. The etching chamber 26 can be used for dry etching and an upper limit of a process temperature in a chamber of the etching chamber 26 is typically 100 to 150° C. Annealing cannot be performed at higher temperature than 150° C. in the etching chamber 26. Meanwhile, when $H_2$ gas is used as the gas G2, the sidewall film is desirably reformed by annealing at or above 300° C. Therefore, the reforming treatment in the second example is performed in the reduction chamber 27 separately provided from the etching chamber 26. The reduction chamber 27 may perform the reforming treatment using liquid such as HCOOH liquid instead of the gas G2. The reduction chamber 27 in this case may be a liquid chemical treatment chamber such as a wet treatment chamber.

As in the case of the first example, the controller 25 controls various kinds of operation of the semiconductor manufacturing apparatus. For example, the controller 25 controls the conveyance of the substrate 1, the etching treatment in the etching chamber 26, and the reforming treatment in the reduction chamber 27.

Figure 5A:
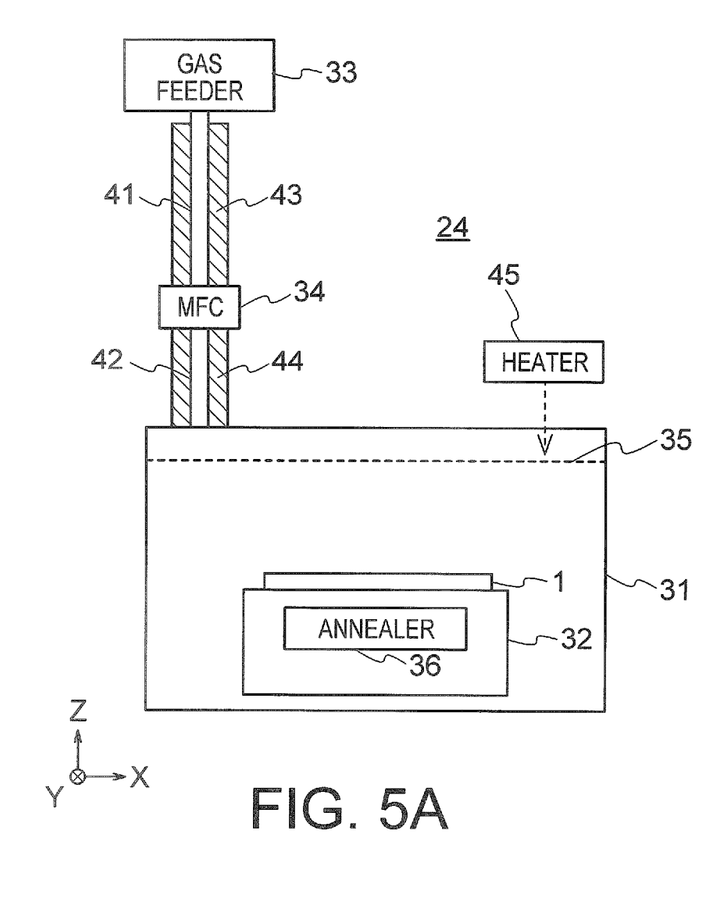
FIGS. 5A and 5B are sectional views showing the structure of the semiconductor manufacturing apparatus of the second embodiment, and a structure of a semiconductor manufacturing apparatus of a comparative example of the second embodiment.
Figure 5B:
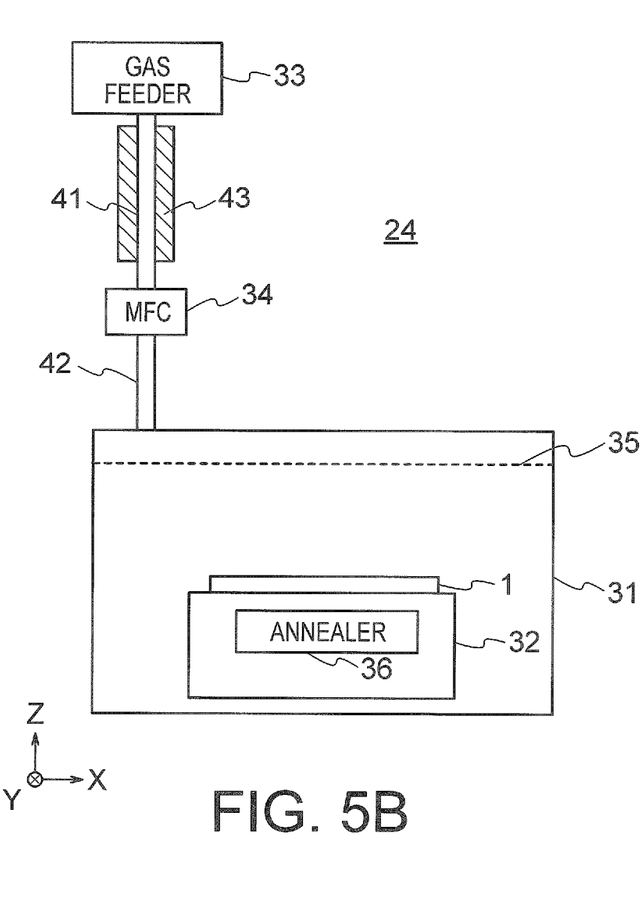

FIGS. 5A and 5B are sectional views showing a structure of the semiconductor manufacturing apparatus of the second embodiment, and a structure of a semiconductor manufacturing apparatus of a comparative example of the second embodiment.

FIG. 5A shows the structure of the semiconductor manufacturing apparatus of the present embodiment, and specifically shows the structure of the treatment chamber 24 in FIG. 4A. In FIG. 5A, the treatment chamber 24 includes a dry etching chamber 31, a stage 32, a gas feeder 33 an MFC (Mass Flow Controller) 34, a shower head 35, an annealer 36, pipes 41 and 42, and heaters 43, 44 and 45. The dry etching chamber is an example of a container, the gas feeder 33 is an example of a first feeder, and the MFC 34 is an example of a first device. The pipe 41 is an example of a second channel, and the pipe 42 is an example of a first channel. The heater 43 is an example of a second heater, the heater 44 is an example of a first heater, and the heater 45 is an example of a third heater.

The dry etching chamber 31 can contain the substrate 1 which is a target for dry etching. In the present embodiment, the aforementioned etching treatment and the aforementioned reforming treatment on the substrate 1 are performed in the dry etching chamber 31.

The stage 32 is used for supporting the substrate 1 in the dry etching chamber 31.

The gas feeder 33 feeds gas with which a film on the substrate 1 can be treated to the dry etching chamber 31. For example, the gas feeder 33 feeds the gas G1 for etching the process target film and forming the sidewall films (sidewall film 11 and the like), and the gas G2 for reforming the sidewall films into the reformed sidewall films (reformed sidewall film 12 and the like). The gas G1, G2 is fed to the dry etching chamber 31 sequentially via the pipe 41, the MFC 34 and the pipe 42, and fed to the shower head 35 in the dry etching chamber 31.

The MFC 34 has a function of measuring a mass flow rate of gas and a function of controlling the mass flow rate of the gas. The MFC 34 of the present embodiment is arranged between the pipe 41 and the pipe 42 and can measure and control the flow rate of gas fed to the dry etching chamber 31 from the gas feeder 33. For example, the controller 25 mentioned above (FIG. 4A) can receive the flow rate of gas measured by the MFC 34 and control the flow rate of the gas via the MFC 34.

The shower head 35 ejects gas fed from the gas feeder 33 into the dry etching chamber 31. The shower head 35 of the present embodiment is arranged near the ceiling of the dry etching chamber 31 and ejects the gas downward in the dry etching chamber 31. Thereby, a film on the substrate 1 placed on the stage 32 can be treated using the gas.

The annealer 36 anneals the substrate 1 on the stage 32. Thereby, the sidewall film on the substrate 1 can be annealed during the aforementioned reforming treatment. The annealer 36 in the present embodiment is provided in the stage 32.

The heater 43 is provided around the pipe 41 and heats gas passing through the pipe 41. Therefore, the heater 43 can heat the gas toward the MFC 34 from the gas feeder 33. The heater 43 of the present embodiment has, for example, a cylindrical shape surrounding the pipe 41.

The heater 44 is provided around the pipe 42 and heats gas passing through the pipe 42. Therefore, the heater 44 can heat the gas toward the dry etching chamber 31 from the MFC 34. The heater 44 of the present embodiment has, for example, a cylindrical shape surrounding the pipe 42.

The heater 45 is used for heating the shower head 35 and a space between the ceiling and the shower head 35 in the dry etching chamber 31. Therefore, the heater 45 can heat gas in the shower head 35 and gas toward the shower head 35 in the dry etching chamber 31.

In the treatment chamber 24 of FIG. 5A, $C_xH_yF_z$ gas is used as the gas G1 and HCOOH gas is used as the gas G2, for example. In addition, in the reforming treatment, the sidewall film on the substrate 1 is annealed at 100 to 150° C. of annealing temperature. In this case, there is a concern that when the temperature of the HCOOH gas is lower than the annealing temperature, the temperature of the sidewall film drops during the annealing, which results in insufficient reforming of the sidewall film.

In the present embodiment, in order to restrain such an event from occurring, the gas G2 is heated by the heaters 43, 44 and 45 while the gas G2 is being fed from the gas feeder 33 for the aforementioned reforming treatment. This makes it possible to restrain the temperature of the gas G2 from significantly dropping until the gas G2 reaches the sidewall film from the gas feeder 33.

In order to effectively restrain the temperature of the gas G2 from dropping as above, the gas G2 is desirably heated as close to the sidewall film as possible. Heating the gas G2 with the heater 44 and/or the heater 45 makes it possible to more effectively restrain the temperature of the gas G2 dropping than in the case of heating the gas G2 with the heater 43.

The heater 43 can be used, for example, for preventing HCOOH gas from being cooled back into HCOOH liquid. Moreover, the heaters 44 and 45 can be used, for example, for preventing HCOOH gas from being cooled back into HCOOH liquid and for feeding the HCOOH gas at high temperature to the sidewall film.

The heater 44 of the present embodiment extends to the inlet of the dry etching chamber 31 from the outlet of the MFC 34. Namely, one end of the heater 44 extends to the outlet of the MFC 34, and the other end of the heater 44 extends to the inlet of the dry etching chamber 31. This makes it possible to restrain the gas G2 from being cooled between the one end of the heater 44 and the outlet of the MFC 34 and the gas G2 from being cooled between the other end of the heater 44 and the inlet of the dry etching chamber 31. Likewise, the heater 43 of the present embodiment extends to the inlet of the MFC 34.

Operation of the treatment chamber 24 in FIG. 5A is controlled by the controller 25 mentioned above (FIG. 4A). For example, the controller 25 controls turning on and off the annealer 36, an annealing time, an annealing temperature, turning on and off the heaters 43, 44 and 45, a heating time, a heating temperature, operations of the chamber 31, the stage 32, the gas feeder 33, the MFC 34 and the shower head 35, and the like.

FIG. 5B shows the structure of the semiconductor manufacturing apparatus of the comparative example of the present embodiment, and specifically shows the structure of the treatment chamber 24 similarly to FIG. 5A. Note that the treatment chamber 24 of the present comparative example does not include the heater 44 or 45. Therefore, in the present comparative example, there is a concern that the temperature of the gas G2 significantly drops until the gas G2 reaches the sidewall film from the gas feeder 33. It should be noted that the heater 43 of the present comparative example does not extend to the inlet of the MFC 34. There is also a concern that this disturbs restraining the temperature of the gas G2 from dropping.

Figure 6:
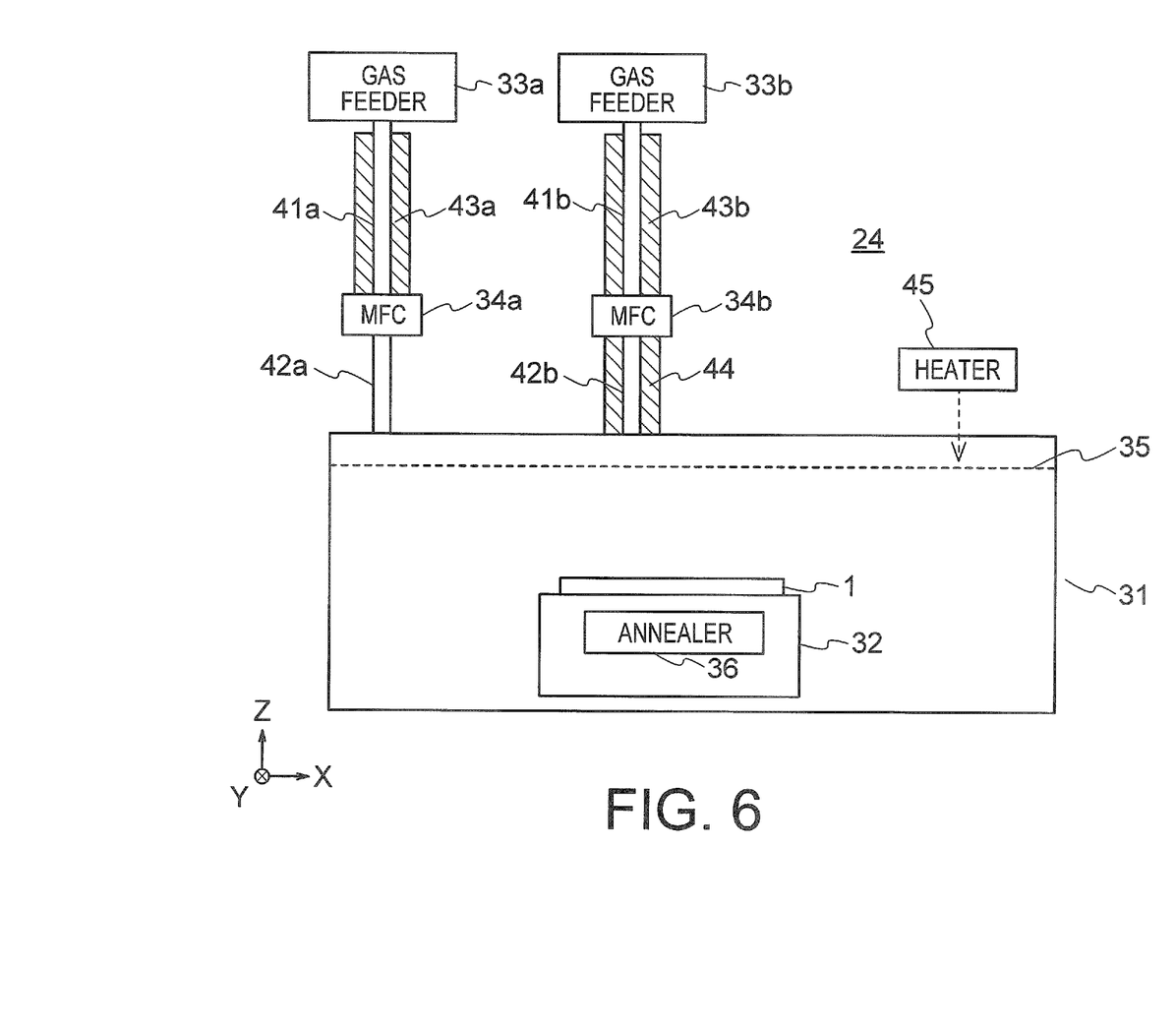
FIG. 6 is a sectional view showing a structure of semiconductor manufacturing apparatus of a first modification of the second embodiment.

FIG. 6 is a sectional view showing a structure of a semiconductor manufacturing apparatus of a first modification of the second embodiment.

FIG. 6 shows a structure of the treatment chamber 24 of the present modification. The structure of the treatment chamber 24 of the present modification is similar to the structure of the treatment chamber 24 shown in FIG. 5A except in the followings. In the present modification, the gas feeder 33, the MFC 34, the pipe 41, the pipe 42 and the heater 43 are replaced by two sets of gas feeders 33a and 33b, MFCs 34a and 34b, pipes 41a and 41b, pipes 42a and 42b, and heaters 43a and 43b.

The structures and the functions of the gas feeder 33a, the MFC 34a, the pipe 41a, the pipe 42a and the heater 43a are similar to those of the gas feeder 33, the MFC 34, the pipe 41, the pipe 42 and the heater 43. Moreover, the structures and the functions of the gas feeder 33b, the MFC 34b, the pipe 41b, the pipe 42b and the heater 43b are similar to those of the gas feeder 33, the MFC 34, the pipe 41, the pipe 42 and the heater 43. Note that in the present modification, the gas feeder 33a feeds the gas G1 and the gas feeder 33b feeds the gas G2. The dry etching chamber 31 is an example of the container, the gas feeder 33b is an example of the first feeder, the MFC 34b is an example of the first device, the gas feeder 33a is an example of a second feeder, and the MFC 34a is an example of a second device. The pipe 41b is an example of the second channel, the pipe 42b is an example of the first channel, and the pipe 41a is an example of a third channel. The heater 43b is an example of the second heater, the heater 44 is an example of the first heater, the heater 45 is an example of the third heater, and the heater 43a is an example of a fourth heater.

The treatment chamber 24 of the present modification includes the heater 44 only around the pipe 42b out of the pipes 42a and 42b. Heating the gas G2 with the heaters 43b, 44 and the like makes it possible to restrain the temperature of the gas G2 from significantly dropping until the gas G2 reaches the sidewall film from the gas feeder 33b. This further makes it possible to restrain the temperature of the gas G2 from significantly changing from the upstream to the downstream of the MFC 34b and to preferably control the flow rate of the gas G2.

Figure 7A:
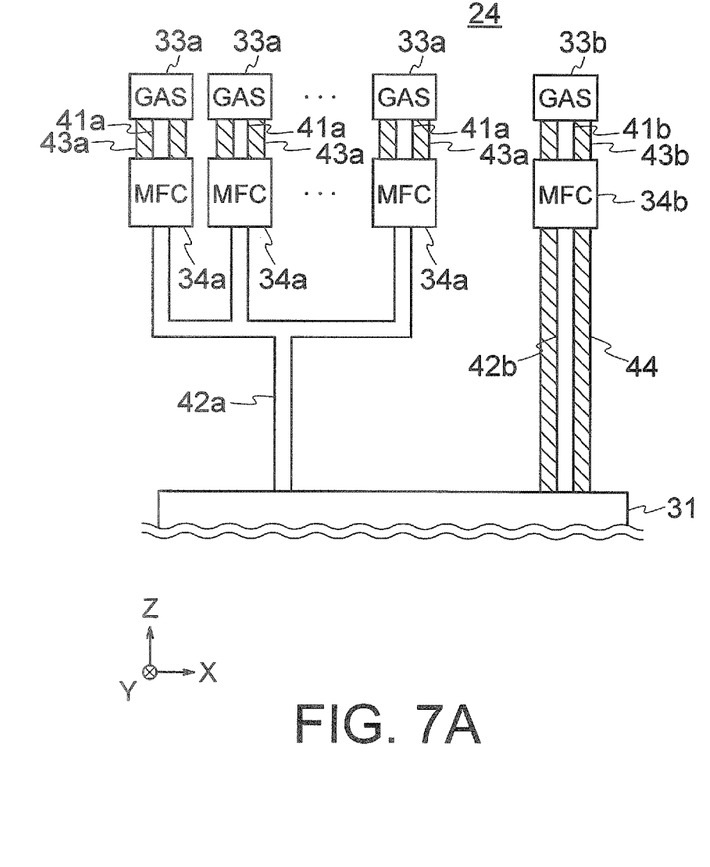
FIGS. 7A and 7B are sectional views showing structures of semiconductor manufacturing apparatuses of second and third modifications of the second embodiment.
Figure 7B:
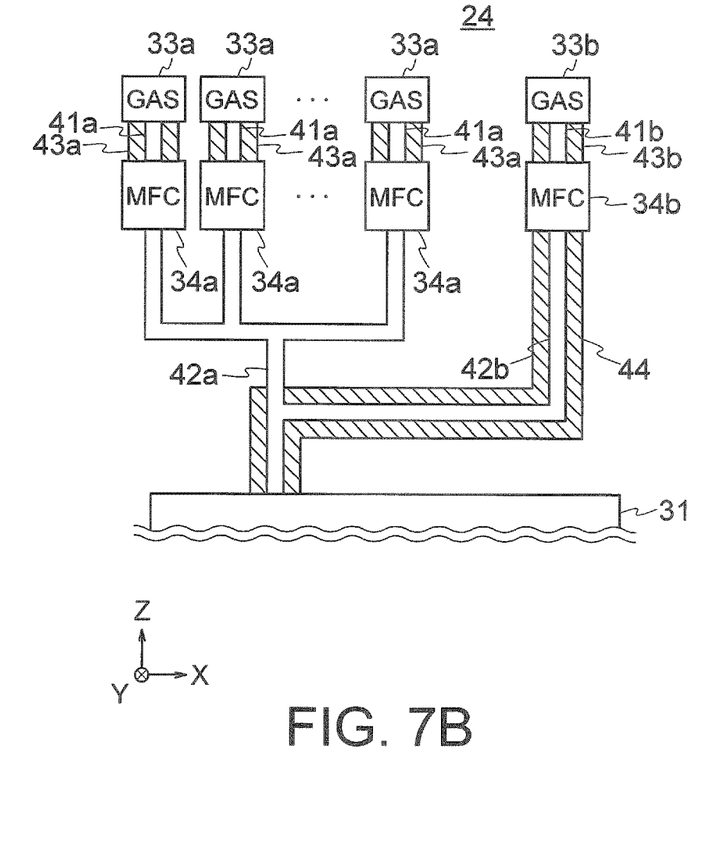

FIGS. 7A and 7B are sectional views showing structures of semiconductor manufacturing apparatuses of second and third modifications of the second embodiment.

FIG. 7A shows a structure of the treatment chamber 24 of the second modification. The structure of the treatment chamber 24 of the present modification is similar to the structure of the treatment chamber 24 of the first modification except in the followings. In the present modification, the gas feeder 33a, the MFC 34a, the pipe 41a, and the heater 43a in the first modification are replaced by N sets of gas feeders 33a, MFCs 34a, pipes 41a, and heaters 43a (N is a integer of two or more).

For example, the semiconductor manufacturing apparatus of the present modification is used when N types of gases are supplied from the N gas feeders 33a as the gas G1. The pipe 42a in the present modification includes N branches that are connected to the N MFCs 34a.

FIG. 7B shows a structure of the treatment chamber 24 of the third modification. The structure of the treatment chamber 24 of the present modification is similar to the structure of the treatment chamber 24 of the second modification except in the followings. The pipe 42a in the present modification is merged into the pipe 42b. This makes it possible to shorten the total length of the pipes 42a and 42b.

As above, the semiconductor manufacturing apparatus of the present embodiment includes the treatment chambers 24 which can perform both the aforementioned etching treatment and the aforementioned reforming treatment, and the heaters 43 (43b), 44 and 45 for restraining the temperature of the gas G2 from dropping. The present embodiment therefore makes it possible to perform the method of manufacturing a semiconductor device of the first embodiment in a preferable mode with this semiconductor manufacturing apparatus.

In the treatment chamber 24 of FIG. 5A, the sidewall film may be reformed by exposing the sidewall film to the gas G2 in the treatment chamber 24 at a predetermined temperature instead of reforming the sidewall film by annealing the sidewall film in an atmosphere of the gas G2. In this case, the temperature of the treatment chamber 24 may be adjusted to be at the predetermined temperature with the heater 45, to be at the predetermined temperature with the annealer 36, or to be at the predetermined temperature with means other than these. Moreover, when the sidewall film is reformed by exposing the sidewall film to the gas G2, the annealer 36 does not have to be provided in the treatment chamber 24 of FIG. 5A. This also applies to the treatment chambers 24 in FIGS. 6, 7A and 7B.

Moreover, the structure of the treatment chamber 24 in FIG. 5A can also be applied to the reduction chamber 27 mentioned above (FIG. 4B). In this case, the gas feeder 33 is used for feeding only the gas G2 out of the gas G1 and the gas G2. This also applies to the treatment chambers 24 in FIGS. 6, 7A and 7B.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
    forming a first film on a substrate;
    etching the first film with first gas including carbon and fluorine to form a concave portion in the first film and form a second film in the concave portion; and
    treating the second film by using a second gas or second liquid,
    wherein the second film is treated without plasma.

2. The method of claim 1, wherein the second film is treated by at least one of annealing the second film in an atmosphere of the second gas or the second liquid and exposing the second film to the second gas or the second liquid at a predetermined temperature.

3. The method of claim 1, wherein the first gas includes $C_xH_yF_z$ gas where C, H and F denote carbon, hydrogen and fluorine, respectively and where x, y and z denote an integer of one or more, an integer of zero or more, and an integer of one or more, respectively.

4. The method of claim 1, wherein the second gas or the second liquid includes hydrogen.

5. The method of claim 4, wherein the second gas or the second liquid includes at least one of hydrogen, formic acid, formaldehyde, methyl alcohol, hydrogen arsenide, borane, hydrogen selenide, phosphine, germane, and a substance having a silyl group.

6. The method of claim 1, wherein the second gas or the second liquid includes sulfur.

7. The method of claim 6, wherein the second gas or the second liquid includes at least one of hydrogen sulfide, sulfur fluoride and carbonyl sulfide.

8. The method of claim 1, wherein the second gas includes helium, argon, krypton or xenon.

9. The method of claim 1, wherein the second gas includes gas obtained from a substance that is liquid at ambient temperature and ambient pressure.

10. The method of claim 1, wherein a ratio of carbon amount per fluorine amount in the second film increases by being treated with the second gas or the second liquid.

11. The method of claim 1, wherein the first film is formed by alternately stacking a plurality of first insulating layers and a plurality of second insulating layers or alternately stacking a plurality of electrode layers and a plurality of insulating layers.

12. The method of claim 1, wherein a first treatment of etching the first film with the first gas and a second treatment of treating the second film with the second gas or the second liquid are performed in a same chamber.

13. The method of claim 1, wherein a first treatment of etching the first film with the first gas and a second treatment of treating the second film with the second gas or the second liquid are alternately performed.

* * * * *